United States Patent
Chen

(10) Patent No.: US 10,476,504 B1
(45) Date of Patent: Nov. 12, 2019

(54) SIGNAL INTERFACE SYSTEM AND DATA TRANSMISSION METHOD THEREOF

(71) Applicant: Nuvoton Technology Corporation, Hsinchu (TW)

(72) Inventor: Yi-An Chen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/252,551

(22) Filed: Jan. 18, 2019

(30) Foreign Application Priority Data

Jul. 19, 2018 (TW) .............................. 107125002 A

(51) Int. Cl.
  *H03K 19/0175* (2006.01)
  *G06F 1/08* (2006.01)
  *G06F 1/10* (2006.01)
  *H03K 19/00* (2006.01)

(52) U.S. Cl.
  CPC ....... *H03K 19/017509* (2013.01); *G06F 1/08* (2013.01); *G06F 1/10* (2013.01); *H03K 19/0008* (2013.01)

(58) Field of Classification Search
  CPC ........ H03K 19/017509; H03K 19/0008; G06F 1/10; G06F 1/08

USPC ........................................................ 326/63
See application file for complete search history.

(56) References Cited

U.S. PATENT DOCUMENTS

2016/0350258 A1* 12/2016 Mangano ............ G06F 13/4027

FOREIGN PATENT DOCUMENTS

| TW | 200935234 | 8/2009 |
| TW | 201001174 | 1/2010 |
| TW | 201642258 | 12/2016 |

\* cited by examiner

*Primary Examiner* — Daniel D Chang
(74) *Attorney, Agent, or Firm* — JCIPRNET

(57) ABSTRACT

A signal interface system and a data transmission method thereof are provided. The signal interface system includes a data line, a clock line, a master circuit, and at least one slave circuit. The master circuit has a main data pin coupled to the data line and a main clock pin coupled to the clock line. The at least one slave circuit has a secondary data pin coupled to the data line and a secondary clock pin coupled to the clock line. The master circuit transmits a main control data to the at least one slave circuit through the data line, and transmits an additional control data to the at least one slave circuit through the clock line.

16 Claims, 3 Drawing Sheets

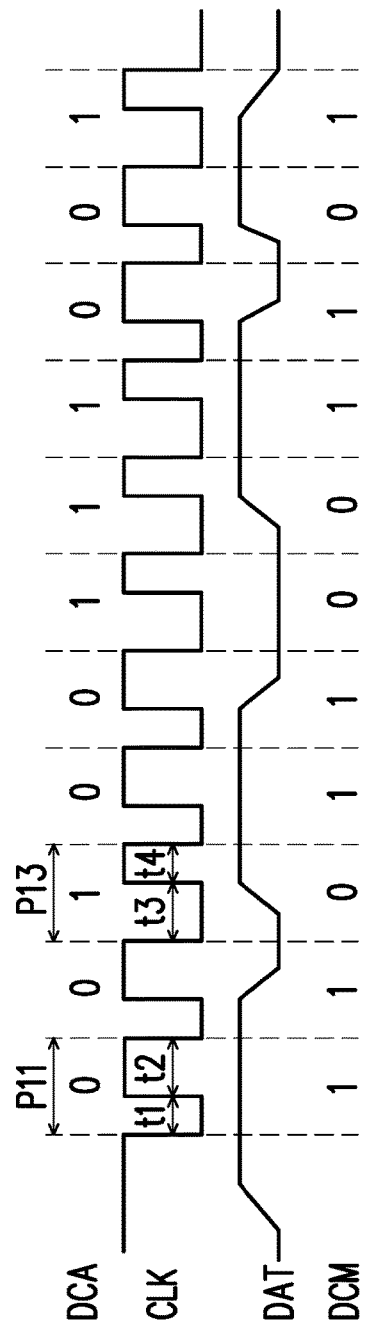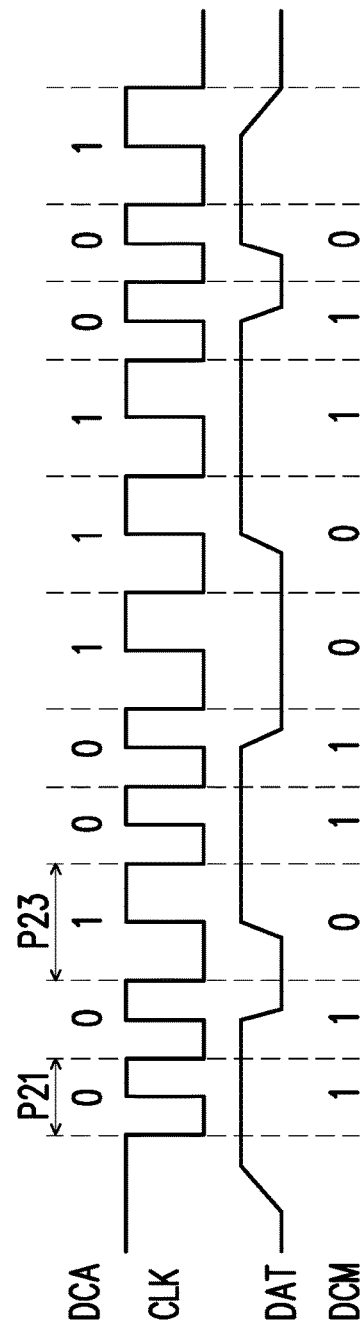

SIGNAL INTERFACE SYSTEM AND DATA TRANSMISSION METHOD THEREOF

CROSS-REFERENCE TO RELATED APPLICATION

This application claims the priority benefit of Taiwan application serial no. 107125002, filed on Jul. 19, 2018. The entirety of the above-mentioned patent application is hereby incorporated by reference herein and made a part of this specification.

BACKGROUND OF THE INVENTION

Field of the Invention

The invention relates to a signal interface, and particularly relates to a signal interface system and a data transmission method thereof.

Description of Related Art

In a single electronic device, a master circuit (such as a controller or a chipset) communicates through a plurality of slave circuits (such as sensors or storage devices) on the bus of the same communication protocol. However, depending on different using requirements, the slave circuits may need to be provided with more information (such as high-resolution sensing requirements). That is, the slave circuits may have a high data volume requirement. At this point, if a slave circuit having a high data volume is used to repair the electronic device, the slave circuits on the same bus may end up having different data volume requirements and may thus receive unused information (i.e., junk information), thereby resulting in wasted signal bandwidth. Alternatively, the slave circuits may end up receiving or transmitting insufficient information (i.e., junk information), thereby resulting in wasted performance of the slave circuits.

On the other hand, if the frequency of the clock signal is increased to adapt to the high data volume, the slave circuits may end up not being able to operate normally. At this point, the slave circuits may need to be fully updated, thereby resulting in an increase in repair costs. Besides, high frequency operation also directly increases the power consumption of the electronic device. Furthermore, the selection of the slave circuits may also be different depending on different application environments. However, due to the limitations of the high/low data volume and/or the high/low operating frequency, the selection of the slave circuits may become more difficult, thereby affecting the design time of the electronic device and/or increasing hardware expenses.

SUMMARY OF THE INVENTION

The invention provides a signal interface system and a data transmission method thereof that may improve system compatibility and maintain good transmission efficiency.

The signal interface system of the invention includes a data line, a clock line, a master circuit, and at least one slave circuit. The master circuit has a main data pin coupled to the data line and a main clock pin coupled to the clock line. The at least one slave circuit has a secondary data pin coupled to the data line and a secondary clock pin coupled to the clock line. The master circuit transmits a main control data to the at least one slave circuit through the data line, and transmits an additional control data to the at least one slave circuit through the clock line.

The data transmission method of the signal interface system in the invention is provided hereinafter, wherein the signal interface system includes a master circuit and at least one slave circuit. A main control data is transmitted to the at least one slave circuit through the master circuit and a data line. An additional control data is transmitted to the at least one slave circuit through the master circuit and a clock line.

Based on the foregoing, in the signal interface system and the data transmission method thereof recited in the embodiments of the invention, the main control data is transmitted through the data line, and the additional control data is transmitted through the clock line. Accordingly, it is possible to prevent the data packet to be transmitted from getting too large, to maintain good transmission efficiency, to keep the slave circuits with different data volume requirements in good operation, and to improve system compatibility.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 2 is a schematic view showing waveforms of a data signal and a clock signal of a signal interface system according to an embodiment of the invention.

FIG. 3 is a schematic view showing waveforms of a data signal and a clock signal of a signal interface system according to another embodiment of the invention.

DESCRIPTION OF THE EMBODIMENTS

Figure 1:
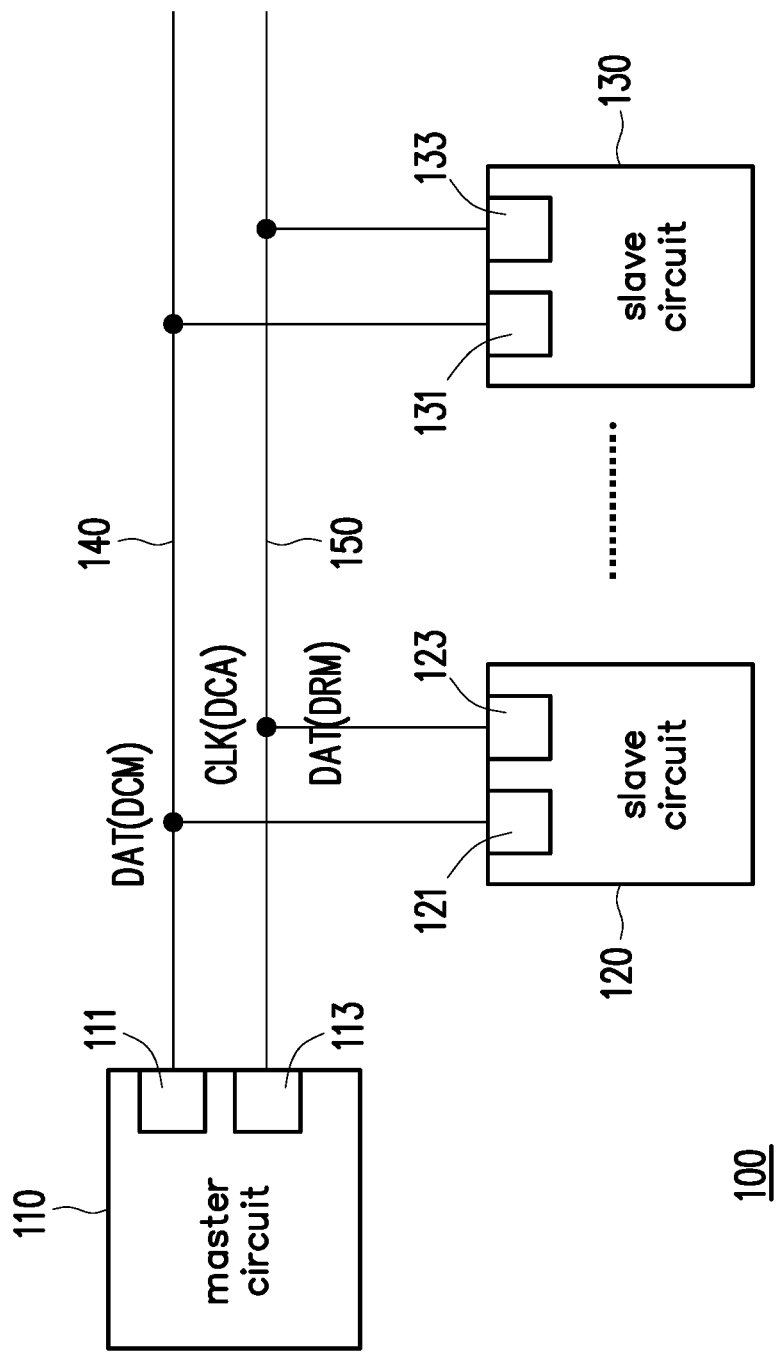
FIG. 1 is a schematic view showing a signal interface system according to an embodiment of the invention.

FIG. 1 is a schematic view showing a signal interface system according to an embodiment of the invention. With reference to FIG. 1, in this embodiment, a signal interface system 100 includes a master circuit 110, at least one slave circuit (such as a slave circuit 120 and a slave circuit 130), a data line 140 and a clock line 150. The master circuit 110 has a main data pin 111 coupled to the data line 140 and a main clock pin 113 coupled to the clock line 150.

The at least one slave circuit (such as the slave circuit 120 and the slave circuit 130) each have a secondary data pin coupled to the data line 140 and a secondary clock pin coupled to the clock line 150. That is, the slave circuit 120 has a secondary data pin 121 coupled to the data line 140 and a secondary clock pin 123 coupled to the clock line 150, and the slave circuit 130 has a secondary data pin 131 coupled to the data line 140 and a secondary clock pin 133 coupled to the clock line 150.

The master circuit 110 may provide a data signal DAT to the data line 140 through the main data pin 111, and the data signal DAT is adapted to transmit a main control data DCM to the at least one slave circuit (such as the slave circuit 120 and the slave circuit 130). Moreover, the master circuit 110 may provide a clock signal CLK to the clock line 150 through the main clock pin 113. The clock signal CLK, in addition to sampling the data signal DAT, is also adapted to transmit an additional control data DCA to the at least one slave circuit (such as the slave circuit 120 and the slave circuit 130). Herein the main control data DCM and the additional control data DCA are approximately transmitted simultaneously.

On the other hand, the at least one slave circuit (such as the slave circuit 120 and the slave circuit 130) may provide the data signal DAT to the data line 140 through the secondary data pin (such as the secondary data pin 121 and the secondary data pin 131). At this time, the data signal DAT is adapted to transmit a return data DRM to the master circuit 110.

In this embodiment, the determination method of the respective logic levels of a plurality of data bits of the main control data DCM according to the data signal DAT is different from the determination method of the respective logic levels of a plurality of data bits of the additional control data DCA according to the clock signal CLK.

According to the foregoing, in the signal interface system 100 of this embodiment, the main control data DCM is transmitted through the data signal DAT on the data line 140, and the additional control data DCA may also be transmitted through the clock signal CLK on the clock line 150. At this time, if the at least one slave circuit (such as the slave circuit 120 and the slave circuit 130) has a low data volume requirement, only the main control data DCM may be received. Conversely, if the at least one slave circuit (such as the slave circuit 120 and the slave circuit 130) has a high data volume requirement, then the main control data DCM and the additional control data DCA may be simultaneously received. Accordingly, it is possible to prevent the data packet to be transmitted (such as the main control data DCM and/or the additional control data DCA) from getting too large, to maintain good transmission efficiency, to keep the slave circuits with different data volume requirements in good operation, and to improve system compatibility. On the other hand, since it is not necessary to increase frequencies of the data signal DAT and the clock signal CLK, the power consumption of the system may be well maintained.

FIG. 2 is a schematic view showing waveforms of a data signal and a clock signal of a signal interface system according to an embodiment of the invention. With reference to FIG. 1 and FIG. 2, in this embodiment, the respective logic levels of the data bits of the main control data DCM are determined according to the voltage level of the corresponding period in the data signal DAT, and the respective logic levels of the data bits of the additional control data DCA are determined according to the duty cycle of the corresponding period in the clock signal CLK.

Furthermore, in this embodiment, a main data receiver of the at least one slave circuit (such as the slave circuit 120 and the slave circuit 130), for example, receives and captures the respective logic levels of the plurality of data bits of the main control data DCM according to the falling edge of the clock signal CLK. Therefore, in a corresponding period P11, the main data receiver of the at least one slave circuit (such as the slave circuit 120 and the slave circuit 130) may capture a high voltage level so as to determine that the logic level of the corresponding data bit in the main control data DCM is the logic level "1". In a corresponding period P13, the main data receiver of the at least one slave circuit (such as the slave circuit 120 and the slave circuit 130) may capture a low voltage level so as to determine that the logic level of the corresponding data bit in the main control data DCM is the logic level "0".

On the other hand, since the circuit operation is affected by component characteristics and environmental factors, it is usually impossible to fix the duty cycle of the clock signal CLK at 50% (an ideal value). Therefore, the main data receiver of the at least one slave circuit (such as the slave circuit 120 and the slave circuit 130) is usually designed to allow a certain error value. That is, the duty cycle at which the clock signal CLK may be received is between an allowable upper limit value (such as 60%) and an allowable lower limit value (such as 40%). At this time, a clock receiver of the at least one slave circuit (such as the slave circuit 120 and the slave circuit 130) may be designed to be able to determine whether the duty cycle of the clock signal CLK is close to the allowable upper limit value (such as 60%) or close to the allowable lower limit value (such as 40%) in order to determine the logic level of the additional control data DCA.

Consequently, a secondary data receiver of the at least one slave circuit (such as the slave circuit 120 and the slave circuit 130), for example, receives and captures the respective logic levels of the plurality of data bits of the additional control data DCA according to the falling edge and the rising edge of the clock signal CLK. Therefore, in the corresponding period P11, the duty cycle of the clock signal CLK captured by the secondary data receiver of the at least one slave circuit (such as the slave circuit 120 and the slave circuit 130) is close to the allowable upper limit value (such as 55-60%), for example. At this time, the secondary data receiver of the at least one slave circuit (such as the slave circuit 120 and the slave circuit 130) may determine that the duty cycle of the clock signal CLK is the allowable upper limit value so as to determine that the logic level of the corresponding data bit in the additional control data DCA is the logic level "0" (a first logic level). Herein the determination range of the allowable upper limit value is set to be 5%, but the embodiments of the invention are not limited thereto. In the corresponding period P13, the duty cycle of the clock signal CLK captured by the secondary data receiver of the at least one slave circuit (such as the slave circuit 120 and the slave circuit 130) is close to the allowable lower limit value (such as 40-45%), for example. At this time, the secondary data receiver of the at least one slave circuit (such as the slave circuit 120 and the slave circuit 130) may determine that the duty cycle of the clock signal CLK is the allowable lower limit value so as to determine that the logic level of the corresponding data bit in the main control data DCM is the logic level "1" (a second logic level). Herein the determination range of the allowable lower limit value is set to be 5%, but the embodiments of the invention are not limited thereto.

In the foregoing embodiment, the determination range of the allowable upper limit value and the determination range of the allowable lower limit value are set to be the same. However, in other embodiments, they may also be set to be different, and there is a certain interval (for example, an interval of 1%) between a range close to the allowable upper limit value and a range close to the allowable lower limit value. Moreover, in the same corresponding period (such as the period P11 and the period P13), the data signal DAT and the clock signal CLK determine one logic level simultaneously. That is, the data rate of the main control data DCM is the same as the data rate of the additional control data DCA.

Furthermore, the secondary data receiver of the at least one slave circuit (such as the slave circuit 120 and the slave circuit 130) may determine the time of the clock signal CLK at the low voltage level (such as t1 and t3) and the time of the clock signal CLK at the high voltage level (such as t2 and t4) in each corresponding period (such as the period P11 and the period P13) through a counter or a timer, thereby determining the duty cycle of the clock signal CLK. In other words, the secondary data receiver of the at least one slave circuit (such as the slave circuit 120 and the slave circuit 130) may receive and start the determination of the time of the low voltage level (such as t1 and t3) according to the falling edge of the clock signal CLK, and may receive and end the determination of the time of the low voltage level (such as t1 and t3) according to the rising edge of the clock signal CLK. Likewise, the secondary data receiver of the at least one slave circuit (such as the slave circuit 120 and the slave circuit 130) may receive and start the determination of the time of the high voltage level (such as t1 and t3) according to the rising edge of the clock signal CLK, and may receive and end the determination of the time of the low voltage level (such as t1 and t3) according to the falling edge of the clock signal CLK.

FIG. 3 is a schematic view showing waveforms of a data signal and a clock signal of a signal interface system according to another embodiment of the invention. With reference to FIG. 1 and FIG. 2, in this embodiment, the respective logic levels of the data bits of the main control data DCM are determined according to the voltage level of the corresponding period in the data signal DAT, and the respective logic levels of the data bits of the additional control data DCA are determined according to the duty cycle or the frequency of the corresponding period in the clock signal CLK. Herein the determination method of the logic levels of the respective data bits of the main control data DCM may be known with reference to FIG. 2, and therefore is not repeated hereinafter.

In actual practice, since the circuit operation is affected by component characteristics and environmental factors, it is usually impossible to fix the frequency of the clock signal CLK at a predetermined value (such as 100 kHz). Therefore, the main data receiver of the at least one slave circuit (such as the slave circuit 120 and the slave circuit 130) is usually designed to allow a certain error value. That is, the frequency at which the clock signal CLK may be received is between an allowable upper limit frequency (such as 110 kHz) and an allowable lower limit frequency (such as 90 kHz). At this time, the secondary data receiver of the at least one slave circuit (such as the slave circuit 120 and the slave circuit 130) may be designed to be able to determine whether the duty cycle of the clock signal CLK is close to the allowable upper limit frequency (such as 110 kHz) or close to the allowable lower limit frequency (such as 90 kHz) in order to determine the logic level of the additional control data DCA.

Consequently, the secondary data receiver of the at least one slave circuit (such as the slave circuit 120 and the slave circuit 130), for example, receives and captures the respective logic levels of the plurality of data bits of the additional control data DCA according to the falling edge of the clock signal CLK. Therefore, in the corresponding period P21, the frequency of the clock signal CLK captured by the secondary data receiver of the at least one slave circuit (such as the slave circuit 120 and the slave circuit 130) is close to the allowable upper limit frequency (such as 105-110 kHz), for example. At this time, the secondary data receiver of the at least one slave circuit (such as the slave circuit 120 and the slave circuit 130) may determine that the frequency of the clock signal CLK is the allowable upper limit frequency so as to determine that the logic level of the corresponding data bit in the additional control data DCA is the logic level "0" (the first logic level). Herein the determination range of the allowable upper limit frequency is set to be 5 kHz, but the embodiments of the invention are not limited thereto. In the corresponding period P23, the frequency of the clock signal CLK captured by the secondary data receiver of the at least one slave circuit (such as the slave circuit 120 and the slave circuit 130) is close to the allowable lower limit frequency (such as 90-95 kHz), for example. At this time, the secondary data receiver of the at least one slave circuit (such as the slave circuit 120 and the slave circuit 130) may determine that the frequency of the clock signal CLK is the allowable lower limit frequency so as to determine that the logic level of the corresponding data bit in the additional control data DCA is the logic level "1" (the second logic level). Herein the determination range of the allowable lower limit frequency is set to be 5 kHz, but the embodiments of the invention are not limited thereto.

In the foregoing embodiment, the determination range of the allowable upper limit frequency and the determination range of the allowable lower limit frequency are set to be the same. However, in other embodiments, they may also be set to be different, and there is a certain interval (for example, an interval of 1 kHz) between a range close to the allowable upper limit frequency and a range close to the allowable lower limit frequency. Moreover, in the same corresponding period (such as the period P21 and the period P23), the data signal DAT and the clock signal CLK determine one logic level simultaneously. That is, the data rate of the main control data DCM is the same as the data rate of the additional control data DCA.

Furthermore, the secondary data receiver of the at least one slave circuit (such as the slave circuit 120 and the slave circuit 130) may determine the time length of the clock signal CLK in each corresponding period (such as the period P11 and the period P13) through a counter or a timer, thereby determining the frequency of the clock signal CLK. In other words, the secondary data receiver of the at least one slave circuit (such as the slave circuit 120 and the slave circuit 130) may receive and start the determination of the time length of each corresponding period according to the falling edge of the clock signal CLK, and may receive and end the determination of the time length of each corresponding period according to the next falling edge of the clock signal CLK.

Figure 4:
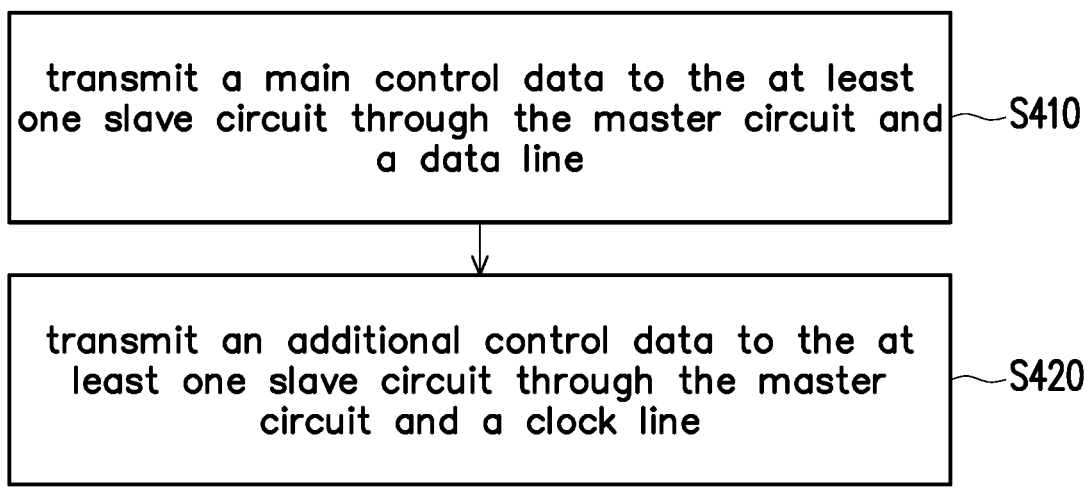
FIG. 4 is a flowchart showing a data transmission method of a signal interface system according to an embodiment of the invention.

FIG. 4 is a flowchart showing a data transmission method of a signal interface system according to an embodiment of the invention. With reference to FIG. 4, in this embodiment, the signal interface system includes a master circuit and at least one slave circuit, and the data transmission method includes the following steps. In step S410, a main control data is transmitted to the at least one slave circuit through the master circuit and a data line. Moreover, in step S420, an additional control data is transmitted to the at least one slave circuit through the master circuit and a clock line. Herein the sequence of the step S410 and the step S420 is illustrative only and is not intended to limit the embodiments of the invention. Besides, details of the step S410 and the step S420 may be known with reference to the embodiments of FIG. 1 to FIG. 3, and therefore are not repeated hereinafter.

In summary, in the signal interface system and the data transmission method thereof recited in the embodiments of the invention, the main control data is transmitted through the data line, and the additional control data is transmitted through the clock line. Accordingly, it is possible to prevent the data packet to be transmitted from getting too large, to maintain good transmission efficiency, to keep the slave circuits with different data volume requirements in good operation, and to improve system compatibility. On the other hand, since it is not necessary to increase the frequencies of the data signal and the clock signal, the power consumption of the system may be well maintained.

Although the embodiments are already disclosed as above, these embodiments should not be construed as limitations on the scope of the invention. It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A signal interface system, comprising:
   a data line;
   a clock line;
   a master circuit having a main data pin coupled to the data line and a main clock pin coupled to the clock line; and
   at least one slave circuit, each having a secondary data pin coupled to the data line and having a secondary clock pin coupled to the clock line;
   wherein the master circuit transmits a main control data to the at least one slave circuit through the data line, and transmits an additional control data to the at least one slave circuit through the clock line,
   wherein the master circuit provides a data signal to the data line through the main data pin to transmit the main control data, and the master circuit provides a clock signal to the clock line through the main clock pin to transmit the additional control data,
   wherein a determination method of respective logic levels of a plurality of data bits of the main control data according to the data signal is different from a determination method of respective logic levels of a plurality of data bits of the additional control data according to the clock signal.

2. The signal interface system as recited in claim 1, wherein the respective logic levels of the plurality of data bits of the main control data are determined according to a voltage level of a corresponding period in the data signal, and the respective logic levels of the plurality of data bits of the additional control data are determined according to a duty cycle or a frequency of a corresponding period in the clock signal.

3. The signal interface system as recited in claim 2, wherein when the duty cycle of the corresponding period in the clock signal is an allowable upper limit value, it is then determined that a corresponding data bit of the additional control data is at a first logic level; and when the duty cycle of the corresponding period in the clock signal is an allowable lower limit value, it is then determined that a corresponding data bit of the additional control data is at a second logic level.

4. The signal interface system as recited in claim 3, a determination range of the allowable upper limit value is same as a determination range of the allowable lower limit value.

5. The signal interface system as recited in claim 4, the determination range of the allowable upper limit value is set to be 5%.

6. The signal interface system as recited in claim 2, wherein when the frequency of the corresponding period in the clock signal is an allowable upper limit frequency, it is then determined that a corresponding data bit of the additional control data is at a first logic level; and when the frequency of the corresponding period in the clock signal is an allowable lower limit frequency, it is then determined that a corresponding data bit of the additional control data is at a second logic level.

7. The signal interface system as recited in claim 6, a determination range of the allowable upper limit frequency is same as a determination range of the allowable lower limit frequency.

8. The signal interface system as recited in claim 7, determination range of the allowable upper limit frequency is set to be 5 kHz.

9. The signal interface system as recited in claim 1, wherein the at least one slave circuit captures respective logic levels of the plurality of data bits of the main control data according to the clock signal, and the at least one slave circuit captures respective logic levels of the plurality of data bits of the additional control data according to the clock signal.

10. The signal interface system as recited in claim 1, wherein a data rate of the main control data is the same as a data rate of the additional control data.

11. A data transmission method of a signal interface system, wherein the signal interface system comprises a master circuit and at least one slave circuit, the data transmission method comprising:
    transmitting a main control data to the at least one slave circuit through the master circuit and a data line; and
    transmitting an additional control data to the at least one slave circuit through the master circuit and a clock line,
    wherein the main control data is transmitted through a data signal on the data line, and the additional control data is transmitted through a clock signal on the clock line,
    wherein a determination method of respective logic levels of a plurality of data bits of the main control data according to the data signal is different from a determination method of respective logic levels of a plurality of data bits of the additional control data according to the clock signal.

12. The data transmission method as recited in claim 11, wherein the respective logic levels of the plurality of data bits of the main control data are determined according to a voltage level of a corresponding period in the data signal, and the respective logic levels of the plurality of data bits of the additional control data are determined according to a duty cycle or a frequency of a corresponding period in the clock signal.

13. The data transmission method as recited in claim 12, further comprising:
    when the duty cycle of the corresponding period in the clock signal is an allowable upper limit value, determining that a corresponding data bit of the additional control data is at a first logic level; and
    when the duty cycle of the corresponding period in the clock signal is an allowable lower limit value, determining that a corresponding data bit of the additional control data is at a second logic level.

14. The data transmission method as recited in claim 12, further comprising:
    when the frequency of the corresponding period in the clock signal is an allowable upper limit frequency, determining that a corresponding data bit of the additional control data is at a first logic level; and
    when the frequency of the corresponding period in the clock signal is an allowable lower limit frequency, determining that a corresponding data bit of the additional control data is at a second logic level.

15. The data transmission method as recited in claim 12, wherein the at least one slave circuit captures respective logic levels of the plurality of data bits of the main control data according to the clock signal, and the at least one slave circuit captures respective logic levels of the plurality of data bits of the additional control data according to the clock signal.

16. The data transmission method as recited in claim 12, wherein a data rate of the main control data is the same as a data rate of the additional control data.

* * * * *